(12) United States Patent  
Matsumoto et al.

(10) Patent No.: US 9,257,408 B2  
(45) Date of Patent: Feb. 9, 2016

(54) SEMICONDUCTOR DEVICE AND METHOD OF MANUFACTURING THE SAME

(71) Applicants: Takayuki Matsumoto, Fukuoka (JP); Hirotaka Onishi, Tokyo (JP); Masuo Koga, Fukuoka (JP)

(72) Inventors: Takayuki Matsumoto, Fukuoka (JP); Hirotaka Onishi, Tokyo (JP); Masuo Koga, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/435,932

(22) PCT Filed: Nov. 21, 2012

(86) PCT No.: PCT/JP2012/080185  
§ 371 (c)(1),  
(2) Date: Apr. 15, 2015

(87) PCT Pub. No.: WO2014/080476  
PCT Pub. Date: May 30, 2014

(65) Prior Publication Data  
US 2015/0262962 A1    Sep. 17, 2015

(51) Int. Cl.  
*H01L 21/44*    (2006.01)  
*H01L 21/50*    (2006.01)  
(Continued)

(52) U.S. Cl.  
CPC ............... *H01L 24/48* (2013.01); *H01L 21/56* (2013.01); *H01L 23/10* (2013.01); *H01L 23/12* (2013.01); *H01L 23/3107* (2013.01); *H01L 23/3128* (2013.01); *H01L 23/3735* (2013.01); *H01L 23/544* (2013.01); *H01L 23/60* (2013.01);

(Continued)

(58) Field of Classification Search  
CPC ....... H01L 24/48; H01L 24/85; H01L 23/544; H01L 23/3107; H01L 21/56; H01L 2224/8513; H01L 2224/85801; H01L 2224/48227; H01L 223/54426  
USPC ............ 438/107, 126, 127, 462, 617; 257/48, 257/678, 686, 687, 784, 787, 797  
See application file for complete search history.

(56) References Cited

U.S. PATENT DOCUMENTS

2008/0284048 A1* 11/2008 Kim ...................... H01L 23/544  
257/797

FOREIGN PATENT DOCUMENTS

JP    S58-063143 A    4/1983  
JP    H01-235362 A    9/1989  
(Continued)

OTHER PUBLICATIONS

Notification of Transmittal of Translation of the International Preliminary Report on Patentability and Translation of Written Opinion of the International Searching Authority; PCT/JP2012/080185; issued on Jun. 4, 2015.

(Continued)

*Primary Examiner* — Hsien Ming Lee  
(74) *Attorney, Agent, or Firm* — Studebaker & Brackett PC

(57) ABSTRACT

A soldering portion (4) and a Ni plating mark (5) are simultaneously forming by plating on a wiring pattern (2) of an insulating substrate (1). A semiconductor chip (6) is mounted on the insulating substrate (1). A position of the insulating substrate (1) is recognized by the Ni plating mark (5) and a wire (7) is bonded to the semiconductor chip (6). An electrode (8) is joined to the soldering portion (4) by solder (9). The insulating substrate (1), the semiconductor chip (6), the wire (7), and the electrode (8) are encapsulated in an encapsulation material (13).

3 Claims, 8 Drawing Sheets

(51) Int. Cl.
*H01L 23/02* (2006.01)
*H01L 23/00* (2006.01)
*H01L 23/60* (2006.01)
*H01L 23/10* (2006.01)
*H01L 23/31* (2006.01)
*H01L 23/373* (2006.01)
*H01L 23/544* (2006.01)
*H01L 23/12* (2006.01)
*H01L 25/18* (2006.01)
*H01L 21/56* (2006.01)
*H01L 25/07* (2006.01)
*H01L 23/498* (2006.01)
*H01L 23/538* (2006.01)

(52) U.S. Cl.
CPC ............... *H01L24/85* (2013.01); *H01L 24/92* (2013.01); *H01L 25/07* (2013.01); *H01L 25/18* (2013.01); *H01L 23/49894* (2013.01); *H01L 23/5386* (2013.01); *H01L 24/29* (2013.01); *H01L 24/32* (2013.01); *H01L 24/49* (2013.01); *H01L 24/73* (2013.01); *H01L 24/83* (2013.01); *H01L 25/072* (2013.01); *H01L 2223/54426* (2013.01); *H01L 2223/54486* (2013.01); *H01L 2224/29101* (2013.01); *H01L 2224/32225* (2013.01); *H01L 2224/4846* (2013.01); *H01L 2224/48227* (2013.01); *H01L 2224/4917* (2013.01); *H01L 2224/49111* (2013.01); *H01L 2224/49113* (2013.01); *H01L 2224/49175* (2013.01); *H01L 2224/73265* (2013.01); *H01L 2224/83132* (2013.01); *H01L 2224/8513* (2013.01); *H01L 2224/85132* (2013.01); *H01L 2224/85801* (2013.01); *H01L 2224/92247* (2013.01); *H01L 2924/00014* (2013.01); *H01L 2924/20656* (2013.01)

(56) References Cited

FOREIGN PATENT DOCUMENTS

| | | |
|---|---|---|
| JP | H02-007536 A | 1/1990 |
| JP | H02-295141 A | 12/1990 |
| JP | H03-273654 A | 12/1991 |
| JP | H06-260585 A | 9/1994 |
| JP | H10-270609 A | 10/1998 |
| JP | 2002-299551 A | 10/2002 |
| JP | 2003-068979 A | 3/2003 |

OTHER PUBLICATIONS

International Search Report; PCT/JP2012/080185; Feb. 12, 2013.

* cited by examiner

SEMICONDUCTOR DEVICE AND METHOD OF MANUFACTURING THE SAME

TECHNICAL FIELD

The present invention relates to a semiconductor device used for electric railway systems, wind power generation, etc., and to method of manufacturing the semiconductor device.

BACKGROUND ART

To secure an insulating property of a semiconductor device, an encapsulation material such as silicone gel is injected into the device. Holes for recognition of the position of an insulating substrate in a process step, e.g., wire bonding are provided in a wiring pattern on the insulating substrate (see, for example, Patent Literature 1).

CITATION LIST

Patent Literature

Patent Literature 1: Japanese Patent Laid-Open No. 2002-299551

SUMMARY OF INVENTION

Technical Problem

If such a position recognition hole exists in the vicinity of a soldering portion, there is a possibility of solder flowing into the hole by flowing out from the soldering portion. When flowing into the hole, the solder is formed into a spherical or disk-like shape by its surface tension. Therefore, if the diameter of the hole is equal to or smaller than 3 mm, there is a possibility of the solder covering only an upper portion of the hole without flowing to the bottom of the hole. Failure of the encapsulation material to flow into the hole and, hence, the formation of a vacant space may therefore result.

The dielectric strength of air in the vacant space is about $\frac{1}{10}$ of that of the encapsulation material, e.g., silicone gel. There is, therefore, a problem that partial discharge occurs between the solder and the insulating substrate in the vacant space. There is also a problem that if the diameter of the position recognition hole is increased, it is not possible to reliably secure the region necessary for assembly.

The present invention has been made to solve the above-described problems, and an object thereof is to provide a semiconductor device and a method of manufacturing the same which can prevent partial discharge.

Means for Solving the Problems

A method of manufacturing a semiconductor device according to the present invention includes: simultaneously forming a soldering portion and a mark by plating on a wiring pattern of an insulating substrate; mounting a semiconductor chip on the insulating substrate; recognizing a position of the insulating substrate by the mark and bonding a wire to the semiconductor chip;

joining an electrode to the soldering portion by solder; and encapsulating the insulating substrate, the semiconductor chip, the wire, and the electrode in an encapsulation material.

Advantageous Effects of Invention

The present invention makes it possible to prevent partial discharge.

DESCRIPTION OF EMBODIMENTS

A semiconductor device and a method of manufacturing the same according to the embodiments of the present invention will be described with reference to the drawings. The same components will be denoted by the same symbols, and the repeated description thereof may be omitted.

Embodiment 1

Figure 1:
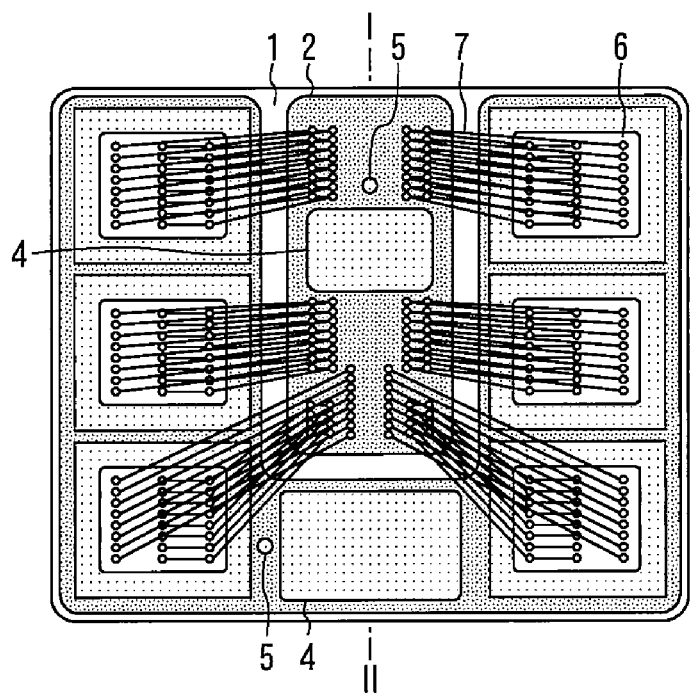
FIG. 1 is a plan view of a semiconductor device according to Embodiment 1 of the present invention.
Figure 2:
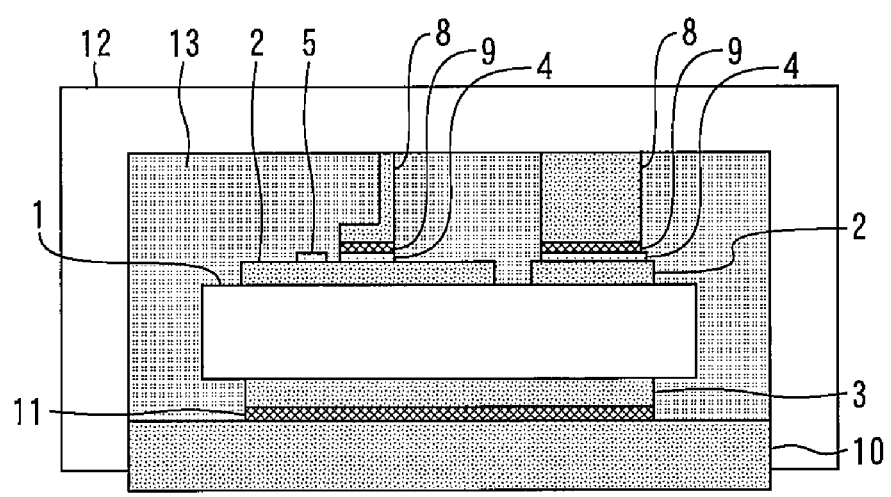
FIG. 2 is a sectional view taken along line I-II in FIG. 1.

FIG. 1 is a plan view of a semiconductor device according to Embodiment 1 of the present invention. FIG. 2 is a sectional view taken along line I-II in FIG. 1. Wiring patterns 2 are provided on an upper surface of an insulating substrate 1, while a metal pattern 3 is provided on a lower surface of the insulating substrate 1. Soldering portions 4 are provided on the wiring patterns 2. Ni plating marks 5 are provided in the wiring patterns 2. The soldering portions 4 and the marks are formed of the same material, which is Ni.

Semiconductor chips 6 are mounted on the insulating substrate 1. Wires 7 are bonded to the semiconductor chips 6. Electrodes 8 are joined to the soldering portions 4 by solder 9. A base plate 10 is joined to the metal pattern 3 by solder 11. All these components are covered with a case 12, and the insulating substrate 1, the semiconductor chips 6, the wires 7 and the electrodes 8 are encapsulated in an encapsulation material 13.

Figure 3:
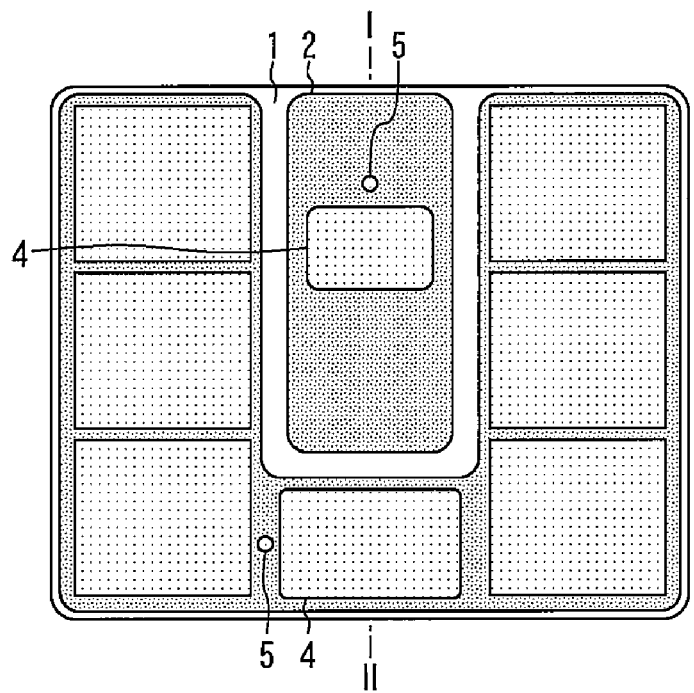
FIG. 3 is a plan view showing steps of manufacturing the semiconductor device according to Embodiment 1 of the present invention.

A method of manufacturing the semiconductor device according to the present embodiment will subsequently be described. FIG. 3 is a plan view showing steps of manufacturing the semiconductor device according to Embodiment 1 of the present invention. First, the soldering portions 4 and the Ni plating marks 5 are simultaneously formed by plating on the wiring patterns 2 on the insulating substrate 1. Next, the semiconductor chips 6 are mounted on the insulating substrate 1.

Next, the position of the insulating substrate 1 is recognized by means of the Ni plating marks 5, and the wires 7 are bonded to the semiconductor chips 6. Subsequently, the electrodes 8 are joined to the soldering portions 4 by solder 9. Subsequently, the base plate 10 is joined to the metal pattern 3 by solder 11. Finally, all these components are covered with the case 12 and the semiconductor chips 6, the wires 7 and the electrodes 8 are encapsulated in the encapsulation material 13.

Figure 4:
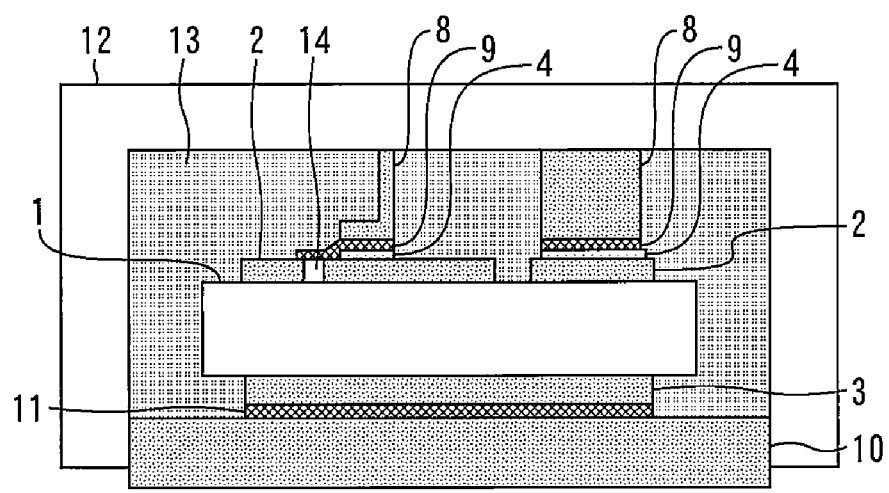
FIG. 4 is a sectional view of a semiconductor device according to a comparative example.

The advantages of the present embodiment will be described in comparison with a comparative example. FIG. 4 is a sectional view of a semiconductor device according to a comparative example. In the comparative example, a hole 14 for position recognition is provided. There is a problem that solder 9 flowing out from the soldering portion 4 covers an upper portion of the hole 14; a vacant space is thereby formed; and partial discharge occurs between the solder 9 and the insulating substrate 1 due to the vacant space.

On the other hand, in the present embodiment, no vacant space is formed even if the solder 9 flowing out from the soldering portions 4 covers the Ni plating marks 5. Prevention of partial discharge can thus be achieved. If the diameter of the Ni plating marks 5 is set equal to or smaller than 3 mm, regions necessary for assembly can be secured with reliability. If the wiring patterns 2 are Al, the soldering portions 4 are ordinarily made by Ni plating. The soldering portions 4 and the N plating marks 5 are therefore formed simultaneously with each other by Ni plating. The number of process steps can thus be reduced.

Embodiment 2

Figure 5:
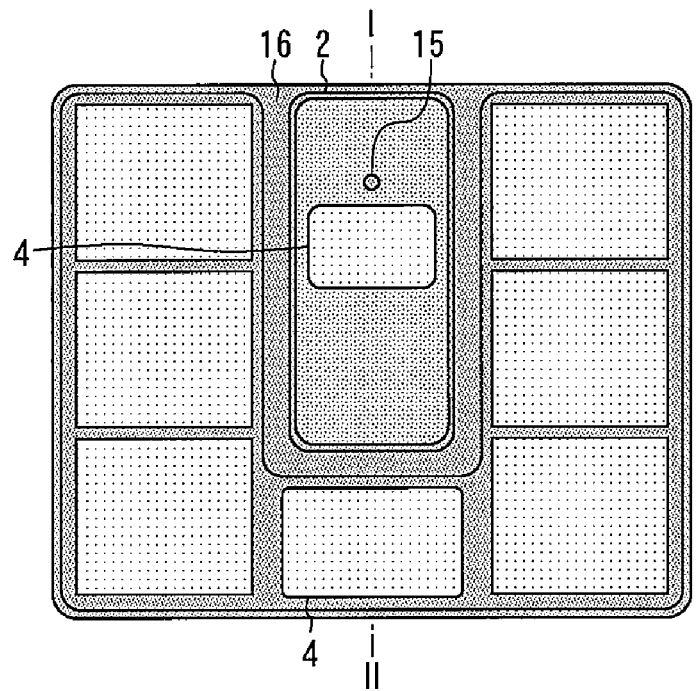
FIG. 5 is a plan view of a semiconductor device according to Embodiment 2 of the present invention.
Figure 6:
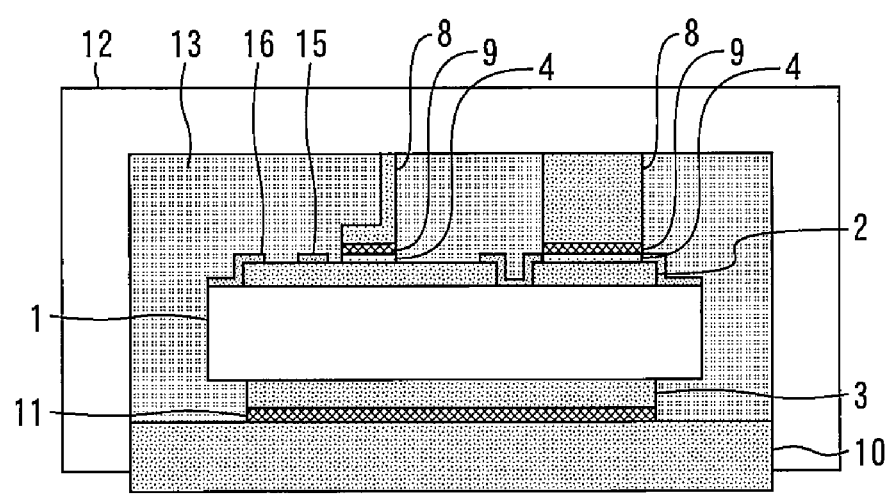
FIG. 6 is a sectional view taken along line I-II in FIG. 5.

FIG. 5 is a plan view of a semiconductor device according to Embodiment 2 of the present invention. FIG. 6 is a sectional view taken along line I-II in FIG. 5. In FIG. 5, illustration of semiconductor chips 6 and wires 7 is omitted.

A resist mark 15 formed of a solder resist is disposed on a wiring pattern 2 in place of the Ni plating mark 5 in Embodiment 1. A protective film 16 formed of the solder resist covers peripheries of wiring patterns 2. The protective film 16 and the resist mark 15 are simultaneously formed of the solder resist. The position of the insulating substrate 1 is recognized by means of the resist mark 15, and the wires 7 are bonded to the semiconductor chips 6. The other components and process steps are the same as those in Embodiment 1.

The solder 9 flowing out from the soldering portion 4 does not attach to the resist mark 15 formed of the solder resist, so that no vacant space is formed. Occurrence of partial discharge can thus be prevented. If the wiring patterns 2 are Cu, peripheries of the soldering portions 4 are ordinarily covered with the projective film 16 formed of the solder resist. The protective film 16 and the resist mark 15 are therefore formed of the solder resist simultaneously with each other. The number of process steps can thus be reduced.

Embodiment 3

Figure 7:
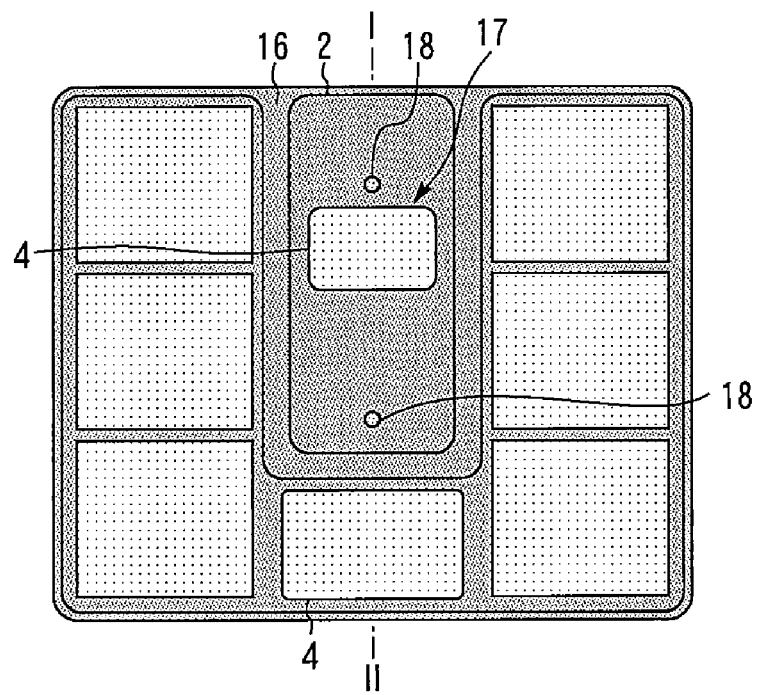
FIG. 7 is a plan view of a semiconductor device according to Embodiment 3 of the present invention.
Figure 8:
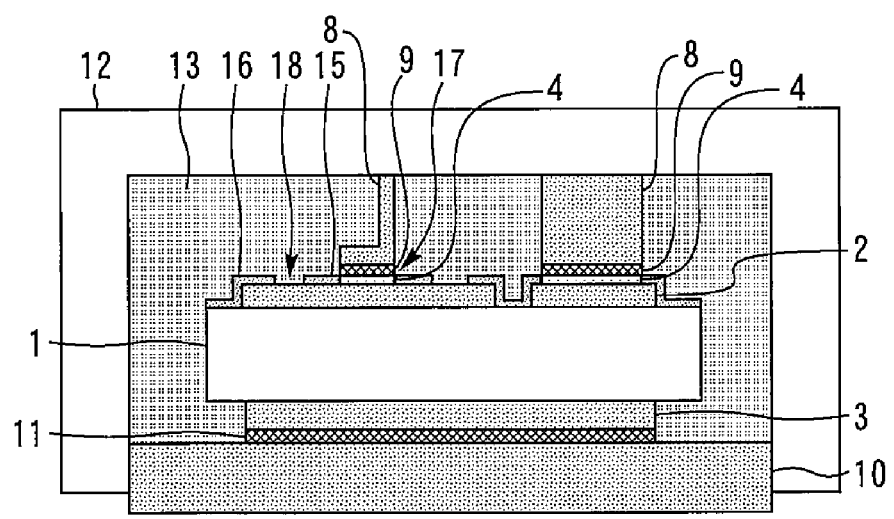
FIG. 8 is a sectional view taken along line I-II in FIG. 7.

FIG. 7 is a plan view of a semiconductor device according to Embodiment 3 of the present invention. FIG. 8 is a sectional view taken along line I-II in FIG. 7. In FIG. 7, illustration of semiconductor chips 6 and wires 7 is omitted.

A protective film 16 formed of a solder resist is provided on the insulating substrate 1. The protective film 16 has openings 17 disposed on the soldering portions 4 and openings 18 disposed on portions other than the soldering portions 4. Electrodes 8 are joined to the soldering portions 4 by solder 9 through the openings 17. The position of the insulating substrate 1 is recognized by means of the openings 18, and the wires 7 are bonded to the semiconductor chips 6. The other components and process steps are the same as those in Embodiment 1.

The solder 9 flowing out from the soldering portions 4 does not attach to the protective film 16 formed of the solder resist and does not reach either of the openings 18, so that no vacant space is formed. Occurrence of partial discharge can thus be prevented. If the wiring patterns 2 are Cu, peripheries of the soldering portions 4 are ordinarily covered with the projective film 16 formed of the solder resist. The openings 18, which are positioning marks, are therefore formed when the protective film 16 is formed. The number of process steps can thus be reduced.

Embodiment 4

Figure 9:
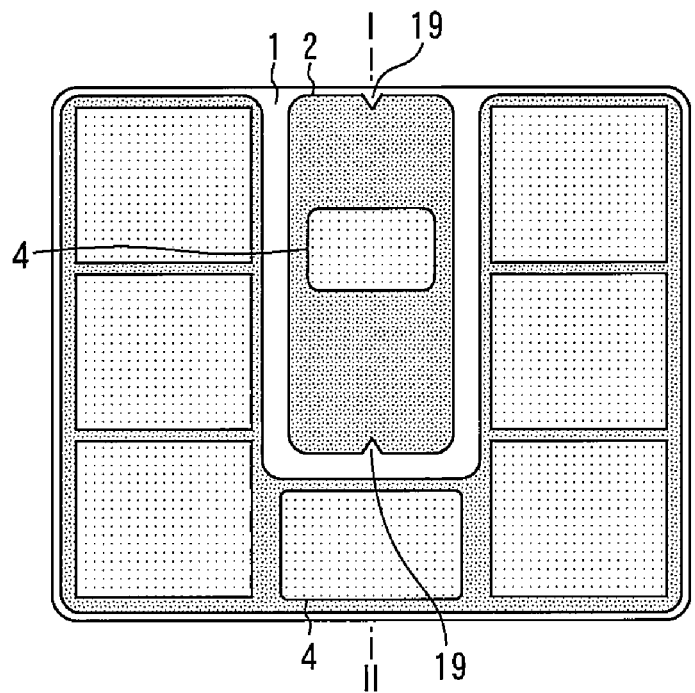
FIG. 9 is a plan view of a semiconductor device according to Embodiment 4 of the present invention.

FIG. 9 is a plan view of a semiconductor device according to Embodiment 4 of the present invention. In FIG. 9, illustration of semiconductor chips 6 and wires 7 is omitted.

Cuts 19 are provided in peripheral portions of a wiring pattern 2 on the insulating substrate 1 in place of the Ni plating mark 5 in Embodiment 1. The position of the insulating substrate 1 is recognized by means of the cuts 19, and the wires 7 are bonded to the semiconductor chips 6. The other components and process steps are the same as those in Embodiment 1.

Even when the solder 9 flowing out from the soldering portions 4 covers upper portions of the cuts 19, the encapsulation material 13 enters the cavities in the cuts 19 from the sides of the wiring pattern 2, so that no vacant space is formed. Prevention of partial discharge can thus be achieved. If the cuts 19 are triangular as viewed in plan, they are wide open at the times of the wiring pattern 2 and the encapsulation material can easily enter the cavities.

Embodiment 5

Figure 10:
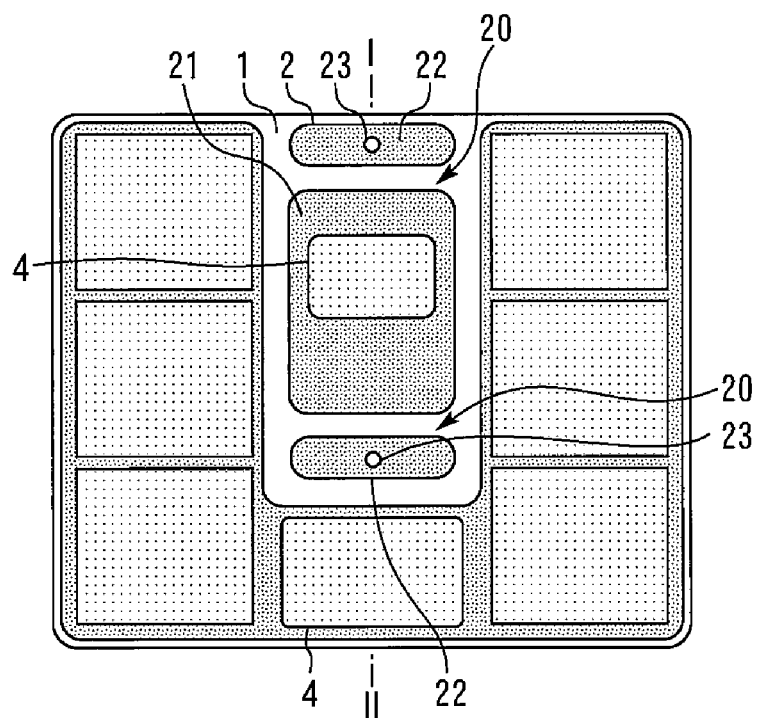
FIG. 10 is a plan view of a semiconductor device according to Embodiment 5 of the present invention.
Figure 11:
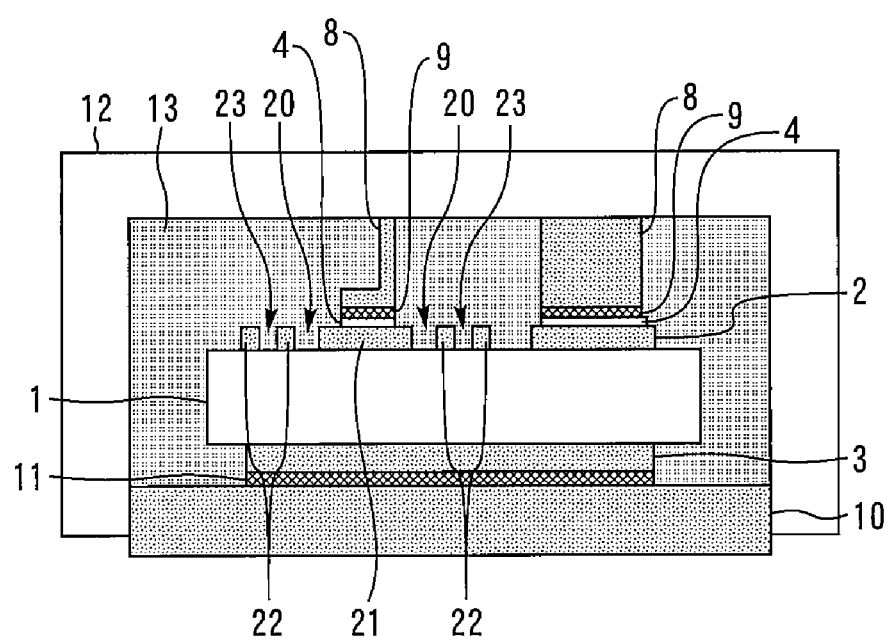
FIG. 11 is a sectional view taken along line I-II in FIG. 10.

FIG. 10 is a plan view of a semiconductor device according to Embodiment 5 of the present invention. FIG. 11 is a sectional view taken along line I-II in FIG. 10. In FIG. 10, illustration of semiconductor chips 6 and wires 7 is omitted.

The insulating substrate 1 has wiring patterns 21 and 22 separated from each other by grooves 20. A soldering portion 4 is provided on the wiring pattern 21. Holes 23 for position recognition are provided in the wiring patterns 22 in place of the Ni plating marks 5 in Embodiment 1. The position of the insulating substrate 1 is recognized by means of the holes 23, and the wires 7 are bonded to the semiconductor chips 6. The other components and process steps are the same as those in Embodiment 1.

The wiring pattern 21 on which the soldering portion 4 is provided and the wiring patterns 22 in which the position recognition holes 23 are provided are separated from each other by the grooves 20. As a result, the solder 9 does not reach either of the holes 23. Prevention of occurrence of partial discharge can thus be achieved. Even when the solder 9 covers upper portions of the grooves 20, the encapsulation material 13 enters the spaces in the grooves from the sides of the wiring patterns 21, 22, so that no vacant space is formed. Prevention of partial discharge can thus be achieved. If the width of the grooves 20 is set equal to or smaller than 1 mm, regions necessary for assembly can be secured with reliability.

Embodiment 6

Figure 12:
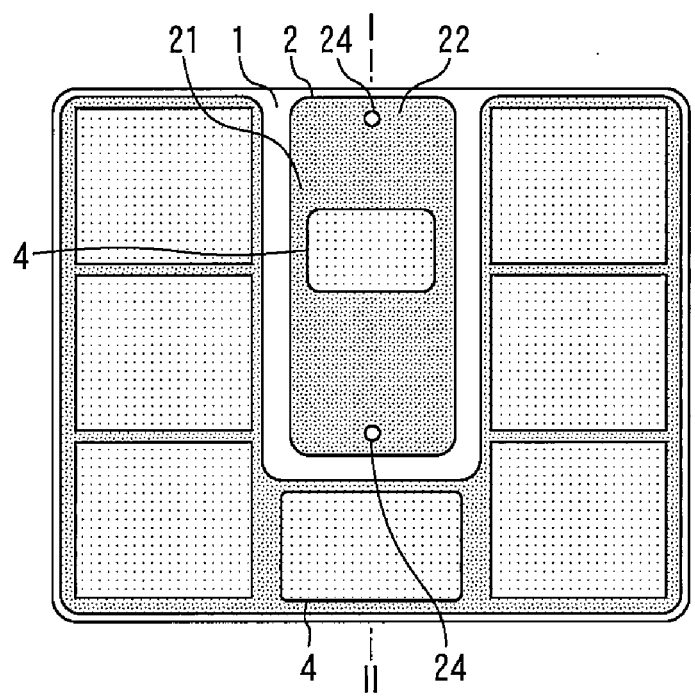
FIG. 12 is a plan view of a semiconductor device according to Embodiment 6 of the present invention.
Figure 13:
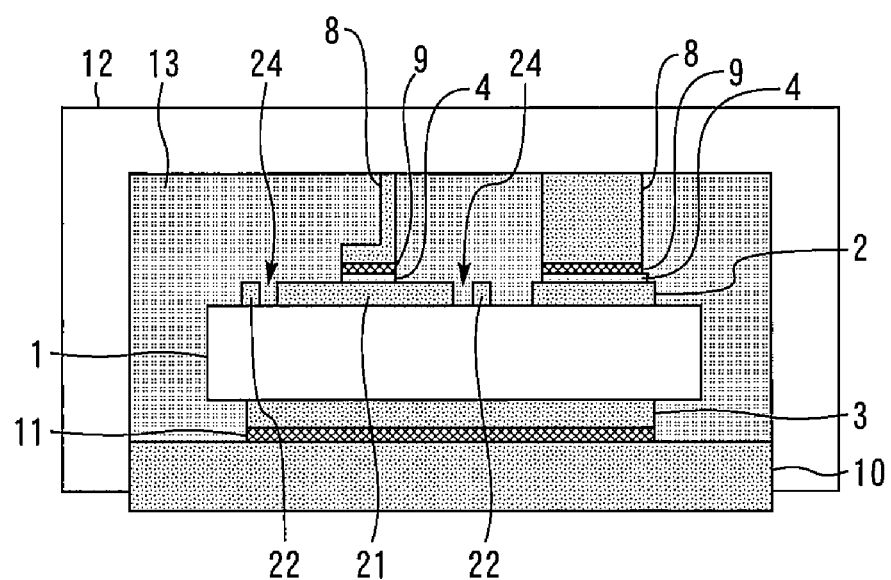
FIG. 13 is a sectional view taken along line I-II in FIG. 12.

FIG. 12 is a plan view of a semiconductor device according to Embodiment 6 of the present invention. FIG. 13 is a sectional view taken along line I-II in FIG. 12. In FIG. 12, illustration of semiconductor chips 6 and wires 7 is omitted.

Holes 24 for position recognition are provided in a wiring pattern 2 in place of the Ni plating marks 5 in Embodiment 1. The position of the insulating substrate 1 is recognized by means of the holes 24, and the wires 7 are bonded to the semiconductor chips 6. The other components and process steps are the same as those in Embodiment 1.

If the spacing between the soldering portion 4 and the holes 24 is set equal to or larger than 5 mm, the solder 9 flowing out from the soldering portion 4 does not reach the hole 24. Prevention of occurrence of partial discharge can thus be achieved. Also, wide regions for wire bonding are secured, thereby enabling securing regions necessary for assembly with reliability.

Embodiment 7

Figure 14:
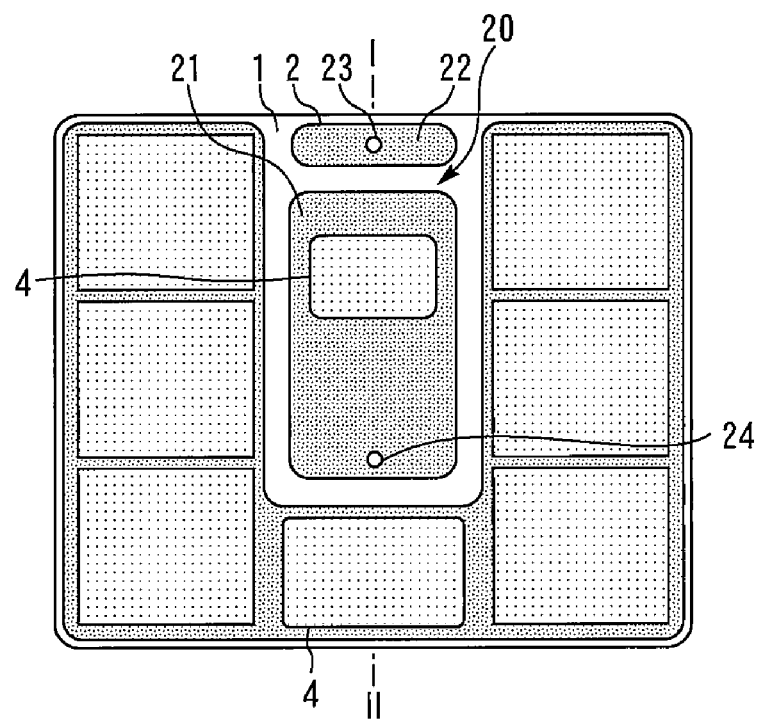
FIG. 14 is a plan view of a semiconductor device according to Embodiment 7 of the present invention.
Figure 15:
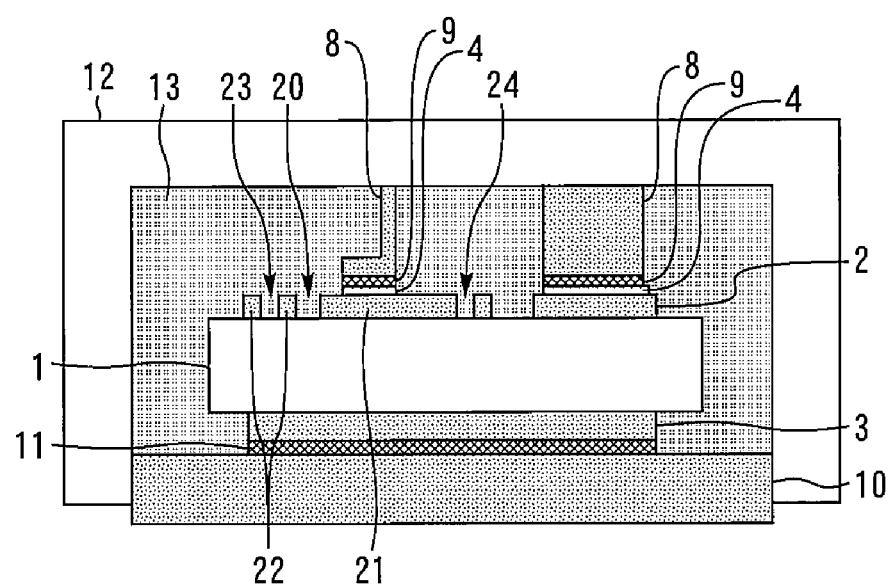
FIG. 15 is a sectional view taken along line I-II in FIG. 14.

FIG. 14 is a plan view of a semiconductor device according to Embodiment 7 of the present invention. FIG. 15 is a sectional view taken along line I-II in FIG. 14. In FIG. 14, illustration of semiconductor chips 6 and wires 7 is omitted.

The insulating substrate 1 has wiring patterns 21 and 22 separated from each other by a groove 20. A soldering portion 4 is provided on the wiring pattern 21. Holes 23 and 24 for position recognition are provided in place of the Ni plating marks 5 in Embodiment 1. The hole 24 is provided in the wiring pattern 21, while the hole 23 is provided in the wiring pattern 22. The position of the insulating substrate 1 is recognized by means of the holes 23 and 24, and the wires 7 are bonded to the semiconductor chips 6. The spacing between the soldering portion 4 and the hole 24 is set equal to or larger than 5 mm. The other components and process steps are the same as those in Embodiment 1.

The wiring pattern 21 on which the soldering portion 4 is provided and the wiring pattern 22 in which the position recognition hole 23 is provided are separated from each other by the groove 20. As a result, the solder 9 does not reach the hole 23. Prevention of occurrence of partial discharge can thus be achieved. If the spacing between the soldering portion 4 and the hole 24 provided on the same wiring pattern 21 is set equal to or larger than 5 mm, the solder 9 flowing out from the soldering portion 4 does not reach the hole 24. Prevention of occurrence of partial discharge can thus be achieved. The degree of design freedom can thus be improved while preventing occurrence of partial discharge.

In each of Embodiments 5 to 7, any of Ni plating marks 5, resist mark 15, solder resist openings 18 or cuts 19 such as those in Embodiments 1 to 4 may be used in place of the position recognition holes 23 and 24. Occurrence of partial discharge can thereby be prevented more reliably.

DESCRIPTION OF SYMBOLS 1 insulating substrate; 2 wiring pattern; 4 soldering portion; 5 Ni plating mark (mark); 6 semiconductor chip; 7 wire; 8 electrode; 9 solder; 13 encapsulation material; 15 resist mark (mark); 17 opening (first opening); 18 opening (second opening); 19 cut; 20 groove; 21 wiring pattern (first wiring pattern); 22 wiring pattern (second wiring pattern); 23,24 hole (mark)

The invention claimed is:

1. A method of manufacturing a semiconductor device comprising:
   simultaneously forming a soldering portion and a mark by plating on a wiring pattern of an insulating substrate;
   mounting a semiconductor chip on the insulating substrate;
   recognizing a position of the insulating substrate by the mark and bonding a wire to the semiconductor chip;
   joining an electrode to the soldering portion by a solder; and
   encapsulating the insulating substrate, the semiconductor chip, the wire, and the electrode in an encapsulation material.

2. A method of manufacturing a semiconductor device comprising:
   forming a soldering portion and a mark on a wiring pattern of an insulating substrate;
   mounting a semiconductor chip on the insulating substrate;
   recognizing a position of the insulating substrate by the mark and bonding a wire to the semiconductor chip;
   joining an electrode to the soldering portion by a solder; and
   encapsulating the insulating substrate, the semiconductor chip, the wire, and the electrode in an encapsulation material,
   wherein a spacing between the soldering portion and the mark is set to at least 5 mm.

3. A semiconductor device comprising:
   an insulating substrate including a wiring pattern;
   a soldering portion provided on the wiring pattern;
   a mark provided on the wiring pattern and formed of same material as the soldering portion;
   a semiconductor chip mounted on the insulating substrate;
   a wire bonded to the semiconductor chip;
   an electrode joined to the soldering portion by a solder; and
   an encapsulation material encapsulating the insulating substrate, the semiconductor chip, the wire, and the electrode.

\* \* \* \* \*